(12) United States Patent
Liao et al.

(10) Patent No.: US 9,887,377 B2
(45) Date of Patent: Feb. 6, 2018

(54) ARRAY SUBSTRATE, DISPLAY PANEL AND DISPLAY DEVICE HAVING THE SAME, AND FABRICATING METHOD THEREOF

(71) Applicant: BOE TECHNOLOGY GROUP CO., LTD., Beijing (CN)

(72) Inventors: Chinlung Liao, Beijing (CN); Chang Yen Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/303,008

(22) PCT Filed: Feb. 22, 2016

(86) PCT No.: PCT/CN2016/074264
§ 371 (c)(1),
(2) Date: Oct. 9, 2016

(87) PCT Pub. No.: WO2016/197624
PCT Pub. Date: Dec. 15, 2016

(65) Prior Publication Data
US 2017/0141341 A1    May 18, 2017

(30) Foreign Application Priority Data

Jun. 12, 2015    (CN) .......................... 2015 1 0325751

(51) Int. Cl.
*H01L 27/32*    (2006.01)
*H01L 51/56*    (2006.01)
(Continued)

(52) U.S. Cl.
CPC ........ *H01L 51/5036* (2013.01); *H01L 27/322* (2013.01); *H01L 27/3211* (2013.01); *H01L 51/56* (2013.01)

(58) Field of Classification Search
CPC ............... H01L 51/5275; H01L 27/322; H01L 27/3213; H01L 2251/558
See application file for complete search history.

(56) References Cited

U.S. PATENT DOCUMENTS

2005/0218792 A1* 10/2005 Jianpu ................. H01L 27/3213
313/502
2006/0238119 A1    10/2006 Spindler
(Continued)

FOREIGN PATENT DOCUMENTS

CN    1738501 A    2/2006
CN    101414664 A    4/2009
(Continued)

OTHER PUBLICATIONS

International Search Report & Written Opinion dated May 30, 2016 regarding PCT/CN2016/074264.
(Continued)

*Primary Examiner* — Kimberly Rizkallah
*Assistant Examiner* — Brian Turner
(74) *Attorney, Agent, or Firm* — Intellectual Valley Law, P.C.

(57) ABSTRACT

The present application discloses an array substrate comprising a light emitting region comprising a plurality of light emitting units. Each of the plurality of light emitting units comprises a first emissive layer of a first light emitting material for emitting a compound light having a first color and a second color; the first color corresponding to a color of light emitted from a first sub-pixel and the second color corresponding to a color of light emitted from a second sub-pixel; and a second emissive layer of a second light emitting material corresponding to a third sub-pixel for
(Continued)

emitting light of a third color. The first color and the second color are different from a color of light from the first emissive layer.

20 Claims, 6 Drawing Sheets

(51) Int. Cl.
*H01L 51/52* (2006.01)
*H01L 51/50* (2006.01)
*H01L 29/20* (2006.01)

(56) References Cited

U.S. PATENT DOCUMENTS

| | | | | |
|---|---|---|---|---|
| 2008/0241592 | A1* | 10/2008 | Fujita | C09K 11/06 428/691 |
| 2013/0015450 | A1 | 1/2013 | Kim et al. | |
| 2014/0175390 | A1 | 6/2014 | Kim et al. | |
| 2014/0183471 | A1* | 7/2014 | Heo | H01L 27/322 257/40 |
| 2015/0014667 | A1 | 1/2015 | Li et al. | |
| 2015/0380470 | A1* | 12/2015 | Lee | H01L 27/3213 257/40 |
| 2016/0133675 | A1* | 5/2016 | Yata | H01L 27/3218 257/89 |
| 2016/0133866 | A1* | 5/2016 | Li | H01L 51/5056 257/40 |

FOREIGN PATENT DOCUMENTS

| | | |
|---|---|---|
| CN | 103165648 A | 6/2013 |
| CN | 103325952 A | 9/2013 |
| CN | 103887319 A | 6/2014 |
| KR | 20150047401 A | 5/2015 |

OTHER PUBLICATIONS

First Office Action in the Chinese Patent Application No. 201510325751.5, dated Jul. 5, 2017; English translation attached.

* cited by examiner

ARRAY SUBSTRATE, DISPLAY PANEL AND DISPLAY DEVICE HAVING THE SAME, AND FABRICATING METHOD THEREOF

CROSS-REFERENCE TO RELATED APPLICATION

This application is a national stage application under 35 U.S.C. §371 of International Application No. PCT/CN2016/074264, filed Feb. 22, 2016, which claims priority to Chinese Patent Application No. 201510325751.5, filed Jun. 12, 2015, the contents of which are incorporated by reference in the entirety.

FIELD

The present invention relates to display technology, more particularly, to an array substrate, a display panel and a display device having the same, and a fabricating method thereof.

BACKGROUND

As compared to other display devices such as liquid crystal display (LCD) devices, the organic light emitting diode (OLED) display devices are self-emitting apparatuses that do not require a backlight. Having the advantages of fast response, a wider viewing angle, high brightness, more vivid color rendering, thinner and lighter, they have found a wide range of applications in display field.

SUMMARY

In one aspect, the present disclosure provides an array substrate comprising a light emitting region comprising a plurality of light emitting units. Each of the plurality of light emitting units comprises a first emissive layer of a first light emitting material for emitting a compound light having a first color and a second color; the first color corresponding to a color of light emitted from a first sub-pixel and the second color corresponding to a color of light emitted from a second sub-pixel; and a second emissive layer of a second light emitting material corresponding to a third sub-pixel for emitting light of a third color.

Optionally, the first color and the second color are different from a color of light from the first emissive layer.

Optionally, the color of light from the first emissive layer, the first color, the second color, and the third color are four different colors.

Optionally, the first emissive layer has a size about twice that of the second emissive layer.

Optionally, the array substrate further comprises a pixel definition layer separating the first emissive layer from the second emissive layer.

Optionally, the first emissive layer is a continuous emissive layer extending throughout a first region corresponding to the first sub-pixel and a second region corresponding to the second sub-pixel.

Optionally, the array substrate further comprises a first color filter for converting light from the first emissive layer into the first color; and a second color filter for converting light from the first emissive layer into the second color.

Optionally, the array substrate further comprises a third color filter for converting light from the second emissive layer into the third color.

Optionally, the first color, the second color and the third color are three different colors selected from red, green and blue, and the color of light from the first emissive layer is yellow.

Optionally, the first light emitting material is a yellow light emitting material, and the second light emitting material is a blue light emitting material.

Optionally, the first light emitting material is a mixture of a red light emitting material and a green light emitting material, and the second light emitting material is a blue light emitting material.

In another aspect, the present disclosure provides a method of fabricating an array substrate comprising forming a light emitting region comprising a plurality of light emitting units. The step of forming each of the plurality of light emitting units comprises forming a first emissive layer of a first light emitting material for emitting a compound light having a first color and a second color; the first color corresponding to a color of light emitted from a first sub-pixel and the second color corresponding to a color of light emitted from a second sub-pixel; and forming a second emissive layer of a second light emitting material corresponding to a third sub-pixel for emitting light of a third color.

Optionally, the first color and the second color are different from a color of light from the first emissive layer.

Optionally, the color of light from the first emissive layer, the first color, the second color, and the third color are four different colors.

Optionally, the first emissive layer has a size about twice that of the second emissive layer.

Optionally, the method further comprises forming a pixel definition layer separating the first emissive layer from the second emissive layer.

Optionally, the first emissive layer is a continuous emissive layer extending throughout a first region corresponding to the first sub-pixel and a second region corresponding to the second sub-pixel.

Optionally, the method further comprises forming a first color filter for converting light from the first emissive layer into the first color; and forming a second color filter for converting light from the first emissive layer into the second color.

Optionally, the method further comprises forming a third color filter for converting light from the second emissive layer into the third color.

Optionally, the first color, the second color and the third color are three different colors selected from red, green and blue, and the color of light from the first emissive layer is yellow.

Optionally, the first light emitting material is a yellow light emitting material, and the second light emitting material is a blue light emitting material.

Optionally, the first light emitting material is a mixture of a red light emitting material and a green light emitting material, and the second light emitting material is a blue light emitting material.

Optionally, the first emissive layer is formed by a solution-based process.

In another aspect, the present disclosure further provides a display panel comprising an array substrate described herein or manufactured by a method described herein, and a package substrate having a color filter layer.

In another aspect, the present disclosure further provides a display device comprising a display panel described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

The present disclosure identifies several issues associated with the convention OLEDs. In a conventional OLED manufacturing process, the sub-pixels of the OLED devices are typically formed by either a solution-based process or a vapor deposition-based process. The vapor deposition process involves the use of a fine metal mask (FMM). The use of FMM makes the fabricating process significantly more complicated, resulting in a high defect rate and high fabricating costs. The solution-based process does not involve the use of FMM. However, the resolution of the sub-pixels formed by the solution-based process is inherently limited by the accuracy of a coating device or a printing device. Thus, it is difficult to achieve high-resolution sub-pixels by a solution-based process.

In another conventional OLED device, the sub-pixels are formed by a combination of the solution-based process and the vapor deposition-based process. For example, the emissive layers of the red sub-pixel and the green sub-pixel are manufactured by a solution-based process, and the emissive layer of the blue sub-pixel is manufactured by a vapor deposition-based process. Nonetheless, the red sub-pixel and the green sub-pixel are formed by a solution-based process, the resolution of these sub-pixels are limited.

The present disclosure provides a novel OLED structure having a much higher sub-pixel resolution but demands a much less complicated fabricating process. In some embodiments, an array substrate according to the present disclosure includes a light emitting region having a plurality of light emitting units. Each light emitting unit includes a first emissive layer of a first light emitting material corresponding to a first sub-pixel for emitting light of a first color and a second sub-pixel for emitting light of a second color, and a second emissive layer of a second light emitting material corresponding to a third sub-pixel for emitting light of a third color. At least one of the first color and the second color is different from a color of light from the first emissive layer. Optionally, the color of light from the first emissive layer, the first color, the second color, and the third color are four different colors. For example, the first, second, and third color are red, green, and blue, and the color of light from the first emissive layer is yellow. In some embodiments, each light emitting unit includes only two emissive layers, the colors of unfiltered light from the only two emissive layers being only two different colors generated by the light emitting unit. In some embodiments, two emissive layers of each light emitting unit generate light for three (or more) sub-pixels in each light emitting unit.

As used herein, the term "sub-pixel" refers to any portion of a pixel which can be independently addressable to emit a specific color. In some embodiments, a sub-pixel may include an emissive layer and a color filter. As used herein, the term "emissive layer" refers to a layer between two electrodes from which the light is generated and emitted. The emissive layer may have a single-layer structure or a stacked-layer structure including two or more sub-layers (e.g., a stacked white OLED layer). As used herein, an emissive layer and a color filter may be considered as separate components of a sub-pixel. Therefore, the emissive layer may emit a light of a color, a color filter may convert (e.g., by filtering) the light emitted from the emissive layer into a different color. Alternatively, the light emitted from the emissive layer may be converted into a different color by a color filter including (e.g., doped with) quantum dots. Accordingly, light emitted from a sub-pixel may have a color different from that of the light emitted from an emissive layer within the sub-pixel.

In some embodiments, the first emissive layer has a size larger than that of the second emissive layer. Optionally, the first emissive layer has a size about twice that of the second emissive layer. For example, the size of the first emissive layer is about 1.5 times to about 2.5 times, about 1.6 times to about 2.4 times, about 1.7 times to about 2.3 times, about 1.8 times to about 2.2 times, about 1.9 times to about 2.1 times, of the size of the second emissive layer.

In some embodiments, the array substrate further includes a pixel definition layer separating the first emissive layer from the second emissive layer. As discussed above, the first emissive layer corresponds to the first sub-pixel and the second sub-pixel, and the second emissive layer corresponds to the third sub-pixel. Thus, the first emissive layer is a continuous emissive layer extending throughout a first region corresponding to the first sub-pixel and a second region corresponding to the second sub-pixel, i.e., the pixel definition layer does not separate the first region from the second region. The first region and the second region of the first emissive layer are integrally formed as one layer.

In some embodiments, the array substrate includes a first organic material layer corresponding to a first sub-pixel for emitting light of a first color and a second sub-pixel for emitting light of a second color and a second organic material layer corresponding to a third sub-pixel for emitting light of a third color. For example, the first organic material layer may include a first emissive layer, a first hole function layer, a first interface modification layer, an additional electron transport layer, and/or a first electron function layer; and the second organic material layer may include a second hole function layer, a second interface modification layer, and a second electron function layer. Optionally, the array substrate further includes a pixel definition layer separating the first organic material layer from the second organic material layer. Optionally, the first organic material layer is a continuous organic material layer extending throughout a first region corresponding to the first sub-pixel and a second region corresponding to the second sub-pixel, i.e., the pixel definition layer does not separate the first region from the second region. The first region and the second region of the first organic material layer are integrally formed as one layer. Each sub-layer of the first organic material layer (e.g., the first hole function layer, the first interface modification layer, the additional electron transport layer, and/or the first electron function layer) is a continuous layer extending throughout the first region and the second region.

In some embodiments, the array substrate further includes a base substrate, a first electrode layer, and a second electrode layer. The base substrate, the first electrode layer, the first emissive layer, the second electrode layer are sequentially on the base substrate along a direction away from the base substrate. Similarly, the first electrode layer, the second emissive layer, the second electrode layer are sequentially on the base substrate along a direction away from the base substrate.

Optionally, the pixel definition layer separates the first electrode layer within a region corresponding to the first emissive layer from the first electrode layer within a region corresponding to the second emissive layer. Further, the first electrode layer within the region corresponding to the first emissive layer includes two separate (electrically non-connected) portions, corresponding to the first sub-pixel and the second sub-pixel, respectively.

In some embodiments, the array substrate further includes a color filter layer. For example, the array substrate may include a first color filter for converting light from the first emissive layer into the first color; and a second color filter for converting light from the first emissive layer into the second color. Optionally, the array substrate further includes a third color filter for converting light from the second emissive layer into the third color. For instance, the first color, the second color and the third color are three different colors selected from red, green and blue, and the color of light from the first emissive layer is yellow. The first color filter and the second color filter are selected from a red color filter and a green color filter. The second light emitting material can be a blue light emitting material. The first light emitting material is a yellow light emitting material, or a mixture of a red light emitting material and a green light emitting material. Optionally, the first light emitting material is a material suitable for a solution-based process such as printing or coating. Optionally, the second light emitting material is a material suitable for a vapor deposition-based process.

Various embodiments of an array substrate having a color filter layer may be practiced. Optionally, the color filter layer is on a side of the first electrode layer proximal to the base substrate. Optionally, the color filter layer is on a side of the second electrode layer distal to the base substrate, e.g., adjacent to the second electrode layer. In some embodiments, the array substrate further includes an encapsulating layer on a side of the second electrode layer distal to the base substrate. Optionally, the color filter layer is on a side of the encapsulating layer distal to the second electrode layer.

In some embodiments, the array substrate includes one or more of a first hole function layer, a first emissive layer, a first interface modification layer, and/or an additional electron transport layer, each of which corresponding to the first sub-pixel and the second sub-pixel. The first hole function layer, the first emissive layer, the first interface modification layer, and the additional electron transport layer are sequentially on the base substrate along a direction away from the base substrate. Optionally, the first hole function layer includes a first hole injection layer and a first hole transport layer sequentially on the base substrate along a direction away from the base.

Optionally, the array substrate further includes a first electron function layer corresponding to the first sub-pixel. The first electron function layer is on a side of the additional electron transport layer distal to the base substrate, and the first electron function layer and the second electron transport layer are in a same layer. Optionally, the first electron function layer includes a first electron transport layer. Optionally, the first electron function layer is a first electron transport layer.

In some embodiments, the array substrate includes one or more of a second hole function layer, a second interface modification layer, a second emissive layer, and/or a second electron function layer, each of which corresponding to the third sub-pixel. The second hole function layer, the second interface modification layer, the second emissive layer, and the second electron transport layer are sequentially on the base substrate along a direction away from the base. Optionally, the additional electron transport layer and the second emissive layer are in a same layer. Optionally, the additional electron transport layer and the second emissive layer are made of a same material. Optionally, the second hole function layer includes a second hole injection layer and a second hole transport layer sequentially on the base substrate along a direction away from the base. Optionally, the first interface modification layer and the second interface modification layer are in a same layer. Optionally, the first hole injection layer and the second hole injection layer are in a same layer. Optionally, the first electron transport layer and the second electron transport layer are in a same layer.

In some embodiments, the color filter layer has a thickness in the range of about 1 µm to about 2.5 µm.

In some embodiments, the additional electron transport layer and the second emissive layer have a thickness in the range of about 15 nm to about 80 nm. Optionally, the additional electron transport layer and the second emissive layer have a thickness of about 20 nm, and the first emissive layer has a thickness of about 60 nm.

Accordingly, the present disclosure provides a novel method of fabricating an array substrate. In some embodiments, the method includes forming a light emitting region including a plurality of light emitting units. In some embodiments, the step of forming each of the plurality of light emitting units includes forming a first emissive layer of a first light emitting material corresponding to a first sub-pixel for emitting light of a first color and a second sub-pixel for emitting light of a second color; and forming a second emissive layer of a second light emitting material corresponding to a third sub-pixel for emitting light of a third color. At least one of the first color and the second color is different from a color of light from the first emissive layer. Optionally, the/color of light from the first emissive layer, the first color, the second color, and the third color are four different colors. For example, the first, second, and third color are red, green, and blue, and the color of light from the first emissive layer is yellow. In some embodiments, each light emitting unit includes only two emissive layers, the colors of unfiltered light from the only two emissive layers being only two different colors generated by the light emitting unit. In some embodiments, two emissive layers of each light emitting unit generate light for three (or more) sub-pixels in each light emitting unit.

In some embodiments, the first emissive layer has a size larger than that of the second emissive layer. Optionally, the first emissive layer has a size about twice that of the second emissive layer. For example, the size of the first emissive layer is about 1.5 times to about 2.5 times, about 1.6 times to about 2.4 times, about 1.7 times to about 2.3 times, about 1.8 times to about 2.2 times, about 1.9 times to about 2.1 times, of the size of the second emissive layer.

In some embodiments, the method further includes forming a pixel definition layer separating the first emissive layer from the second emissive layer. As discussed above, the first emissive layer corresponds to the first sub-pixel and the second sub-pixel, and the second emissive layer corresponds to the third sub-pixel. Thus, the first emissive layer is a continuous emissive layer extending throughout a first region corresponding to the first sub-pixel and a second region corresponding to the second sub-pixel, i.e., the pixel definition layer does not separate the first region from the second region. The first region and the second region of the first emissive layer are integrally formed as one layer.

In some embodiments, the method further includes forming a first electrode layer on a substrate; and forming a second electrode layer. The first/second emissive layer is on a side of the first electrode layer distal to the base substrate, and the second electrode layer is on a side of the first/second emissive layer distal to the first electrode layer. The base substrate, the first electrode layer, the first emissive layer, the second electrode layer are sequentially on the base substrate along a direction away from the base substrate. Similarly, the first electrode layer, the second emissive layer, the second electrode layer are sequentially on the base substrate along a direction away from the base substrate.

Optionally, the pixel definition layer separates the first electrode layer within a region corresponding to the first emissive layer from the first electrode layer within a region corresponding to the second emissive layer. Further, the first electrode layer within the region corresponding to the first emissive layer includes two separate (electrically non-connected) portions, corresponding to the first sub-pixel and the second sub-pixel, respectively.

In some embodiments, the method further includes forming a color filter layer. For example, the method may include forming a first color filter for converting light from the first emissive layer into the first color; and forming a second color filter for converting light from the first emissive layer into the second color. Optionally, the method further includes forming a third color filter for converting light from the second emissive layer into the third color. For instance, the first color, the second color and the third color are three different colors selected from red, green and blue, and the color of light from the first emissive layer is yellow. The first color filter and the second color filter are selected from a red color filter and a green color filter. The second light emitting material can be a blue light emitting material. The first light emitting material is a yellow light emitting material, or a mixture of a red light emitting material and a green light emitting material. Optionally, the first light emitting material is a material suitable for a solution-based process such as printing or coating. Optionally, the second light emitting material is a material suitable for a vapor deposition-based process.

Various embodiments of an array substrate having a color filter layer may be practiced. Optionally, the color filter layer is formed on a side of the first electrode layer proximal to the base substrate. Optionally, the color filter layer is formed on a side of the second electrode layer distal to the base substrate, e.g., adjacent to the second electrode layer. In some embodiments, the method further includes forming an encapsulating layer on a side of the second electrode layer distal to the base substrate. Optionally, the color filter layer is on a side of the encapsulating layer distal to the second electrode layer.

In some embodiments, the method further includes forming one or more of a first hole function layer, a first interface modification layer, and/or an additional electron transport layer, each of which corresponding to the first sub-pixel and the second sub-pixel. The first hole function layer, the first emissive layer, the first interface modification layer, and the additional electron transport layer are sequentially on the base substrate along a direction away from the base substrate. Optionally, the first hole function layer includes a first hole injection layer and a first hole transport layer sequentially on the base substrate along a direction away from the base.

Optionally, the method further includes forming a first electron function layer corresponding to the first sub-pixel. The first electron function layer is formed on a side of the additional electron transport layer distal to the base substrate, and the first electron function layer and the second electron transport layer are in a same layer. Optionally, the first electron function layer includes a first electron transport layer. Optionally, the first electron function layer is a first electron transport layer.

In some embodiments, the method further includes forming one or more of a second hole function layer, a second interface modification layer, and/or a second electron function layer, each of which corresponding to the third sub-pixel. The second hole function layer, the second interface modification layer, the second emissive layer, and the second electron transport layer are sequentially on the base substrate along a direction away from the base. Optionally, the additional electron transport layer and the second emissive layer are in a same layer. Optionally, the additional electron transport layer and the second emissive layer are made of a same material. Optionally, the second hole function layer includes a second hole injection layer and a second hole transport layer sequentially on the base substrate along a direction away from the base. Optionally, the first interface modification layer and the second interface modification layer are in a same layer. Optionally, the first hole injection layer and the second hole injection layer are in a same layer. Optionally, the first electron transport layer and the second electron transport layer are in a same layer.

In some embodiments, the first emissive layer is formed by a solution-based process, e.g., printing or coating. In some embodiments, the first interface modification layer and the second interface modification layer are in a same layer, the second emissive layer is formed by a vapor deposition process on a side of the second interface modification layer distal to the base substrate, and the additional electron transport layer is formed on a side of the second interface modification layer distal to the base substrate.

In some embodiments, the color filter layer has a thickness in the range of about 1 µm to about 2.5 µm.

In some embodiments, the additional electron transport layer and the second emissive layer have a thickness in the range of about 15 nm to about 80 nm. Optionally, the additional electron transport layer and the second emissive layer have a thickness of about 20 nm, and the first emissive layer has a thickness of about 60 nm.

Figure 1:
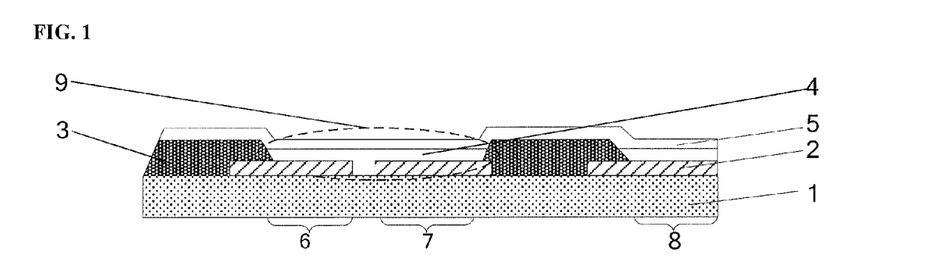
FIG. 1 is a diagram illustrating the structure of an array substrate in some embodiments.

FIG. 1 is a diagram illustrating the structure of an array substrate in some embodiments. Referring to FIG. 1, the array substrate in the embodiment includes a base substrate 1, a first electrode layer 2 on the base substrate 1, a pixel definition layer 3 on a side of the first electrode layer 2 distal to the base substrate 1. The pixel definition layer 3 includes apertures 9 exposing the first electrode layer 2. The array substrate further includes an organic material layer 4 on a side of the first electrode layer 2 distal to the base substrate in a region corresponding to the apertures 9, a second electrode layer 5 on a side of the organic material layer 4 distal to the first electrode layer 2. The array substrate in the embodiment includes a first sub-pixel 6, a second sub-pixel 7, and a third sub-pixel 8.

Optionally, the array substrate further includes a color filter. Optionally, the color filter has a thickness of about 1 μm to about 2.5 μm.

As shown in FIG. 1, the array substrate in the embodiment has an organic material layer 4 that continuously extends throughout a first region corresponding to the first sub-pixel 6 and a second region corresponding to the second sub-pixel 7. The pixel definition layer 3 separates the organic material layer 4 within to a third region corresponding to the third sub-pixel 8 from the first region and the second region. The pixel definition layer 3, however, does not separate the first region from the second region of the organic material layer 4.

Optionally, the structure of the organic material layer 4 within the first region is the same as the structure of the organic material layer 4 within the second region. Optionally, each sub-layer (e.g., emissive layer) of the organic material layer 4 within the first region is made of a same material as that within the second region.

By having a continuous and uniform organic material layer 4 throughout the first region and the second region, the colors of light from the emissive layer (i.e., unfiltered light) within the first region and the second region are the same. For example, the color of light from the emissive layer within the first region and the second region is yellow, and the color of light from the emissive layer (i.e., unfiltered light) within the third region is blue. As discussed above, in the conventional array substrate, the structure and/or material of the organic material layer 4 within the first region are different from those within the second region. For instance, in a conventional array substrate, the color of light from the emissive layer within the first region is red, the color of light from the emissive layer within the second region is green, and the color of light from the emissive layer within the third region is blue. Thus, the array substrate of the present disclosure has a strikingly different structure and arrangement. Specifically, as discussed above, the array substrate of the present disclosure includes only two separate emissive layer within each light emitting unit (e.g., a pixel), whereas the conventional array substrate includes three or more separate emissive layers. Further, the emissive layer within the first region and the second region is a continuous emissive layer extending throughout the first region corresponding to the first sub-pixel and the second region corresponding to the second sub-pixel, i.e., the pixel definition layer does not separate the first region from the second region of the emissive layer. Moreover, the structures and materials of the emissive layer/organic material layer (or sub-layers thereof) within the first region and the second region are the same. Accordingly, in some embodiments, the emissive layer within the first region and the second region has a much increased size (e.g., about twice, about 1.5 times to 2.5 times) as compared to that of the emissive layer within the third region (i.e., corresponding to the third sub-pixel). Due to the increased size of the emissive layer and the organic material layer 4 within the first region and the second region, the resolution of the emissive layer/sub-pixels are as limited by the accuracy of the printing/coating devices as in the conventional array substrate. Thus, a much higher resolution and improved image display quality can be achieved in a display panel having the array substrate according to the present disclosure.

Figure 2:
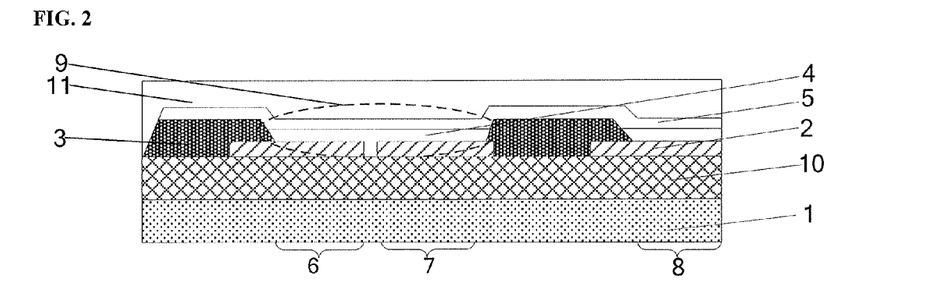
FIG. 2 is a diagram illustrating the structure of an array substrate in some embodiments.
Figure 3:
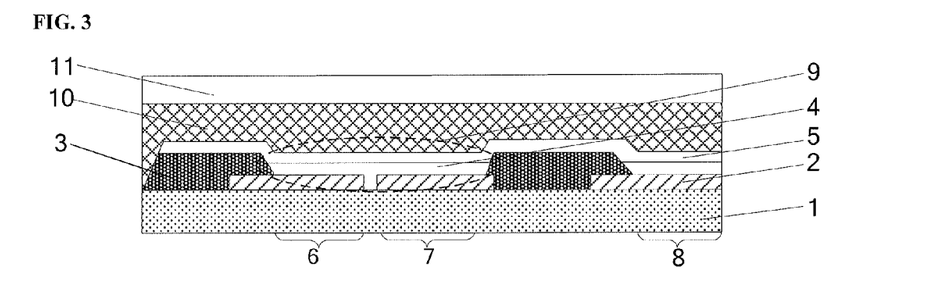
FIG. 3 is a diagram illustrating the structure of an array substrate in some embodiments.
Figure 4:
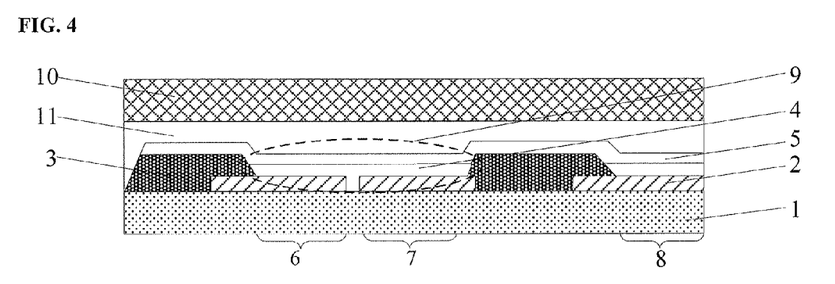
FIG. 4 is a diagram illustrating the structure of an array substrate in some embodiments.

In some embodiments, the array substrate further includes a color filter layer. FIGS. 2-4 are diagrams illustrating the structure of an array substrate in some embodiments. Referring to FIG. 2, the array substrate in the embodiment includes a color filer layer 10 on a side of the first electrode layer 2 proximal to the base substrate 1. An OLED device having such an array substrate is a bottom-emitting type OLED device. Referring to FIGS. 3-4, the array substrate in the embodiment includes a color filer layer 10 on a side of the second electrode layer 5 distal to the bases substrate 1 and the organic material layer 4. For example, the color filter layer 10 can be adjacent to and directly in contact with the second electrode layer 5 (FIG. 3). Alternatively, the array substrate may further include an encapsulating layer 11 on a side of the second electrode layer 5 distal to the base substrate 1, the color filter layer 10 is on a side of the encapsulating layer 11 distal to the second electrode layer 5 (FIG. 4). The color filter layer 10 is between the encapsulating layer 11 and the second electrode layer 5 (FIG. 4). An OLED device having an array substrate structure in FIG. 3 or FIG. 4 is a top-emitting type OLED device.

In some embodiments, the first sub-pixel 6 is a red sub-pixel, the second sub-pixel 7 is a green sub-pixel, and the third sub-pixel is a blue sub-pixel. The color filter layer 10 includes a first color filter corresponding to the first sub-pixel, and a second color filter corresponding to the second sub-pixel. For example, the first color filter is a red color filter, and the second color filter is a green color filter. Optionally, the color filter layer 10 further includes a third color filter corresponding to the third sub-pixel, e.g., a blue color filter. By including a color filter layer in the array substrate, a full-color RGB display may be achieved.

Figure 5:
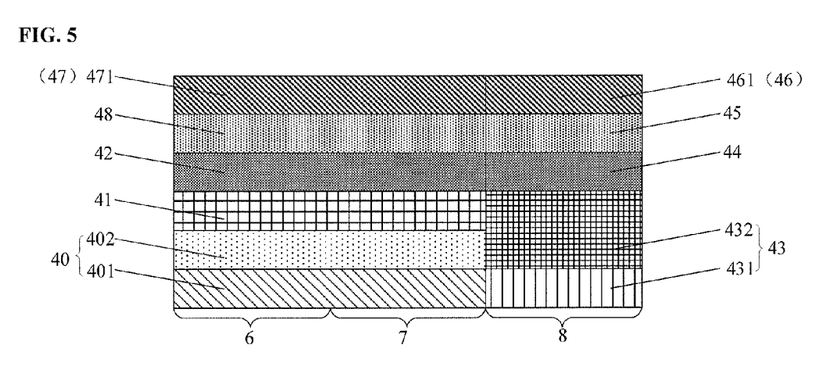
FIG. 5 is a diagram illustrating the structure of an organic material layer in some embodiments.

FIG. 5 is a diagram illustrating the structure of an organic material layer 4 in some embodiments. Referring to FIG. 5, the organic material layer 4 corresponding to the first sub-pixel 6 and the second sub-pixel 7 in the embodiment includes a first hole function layer 40, a first emissive layer 41, and/or a first interface modification layer 42. Optionally, the organic material layer 4 corresponding to the first sub-pixel 6 and the second sub-pixel 7 further includes an additional electron transport layer 48. The additional electron transport layer 48 is on a side of the first interface modification layer 42 distal to the first emissive layer 41. The organic material layer 4 corresponding to the third sub-pixel 8 in the embodiment includes a second hole function layer 43, a second interface modification layer 44, a second emissive layer 45, and/or a second electron function layer 46. Optionally, the second emissive layer 45 and the additional electron transport layer 48 are in a same layer.

Optionally, the first emissive layer 41 is made of a material suitable for a solution-based process such as a printing process or a coating process. Optionally, the first emissive layer 41 is deposited using a solution-based process such as a printing process or a coating process. As discussed above, the array substrate according to the present disclosure has a much increased size for the first emissive layer 41. The increase emissive layer size compensates for any inaccuracy associated with the devices for applying a solution-based process (e.g., printing, coating devices), a higher resolution display panel can be made even with a solution-based fabrication process.

Optionally, the second emissive layer 45 and/or the additional electron transport layer 48 is made of a material suitable for a vapor deposition-based process. Optionally, the second emissive layer 45 and/or the additional electron transport layer 48 is deposited using a vapor deposition-based process. Thus, the second emissive layer 45 and the additional electron transport layer 48 are integrally formed throughout the entire light emitting unit (e.g., the entire pixel), a complex fabricating process using a FMM is not required. Based on the above, the present array substrate and display panel having the same demands a much simplified fabricating process and a much lower manufacturing cost. As shown in FIG. 5, electrons travel through the first emissive layer 41 and the first interface modification layer 42 before they enter into the additional electron transport layer 48. The function of the additional electron transport layer 48 is transporting electrons.

Referring to FIG. 5, the organic material layer 4 corresponding to the first sub-pixel 6 and the second sub-pixel 7 in the embodiment further includes a first electron function layer 47 on a side of the additional electron transport layer 48 distal to the first emissive layer 41.

Referring to FIG. 5, the first hole function layer 40 includes a first hole injection layer 401 and a first hole transport layer 401 on a side of the first hole injection layer 402 distal to the base substrate 1. The second hole function layer 43 includes a second hole injection layer 431 and a second hole transport layer 432 on a side of the second hole injection layer 431 distal to the base substrate 1. The first electron function layer 47 includes a first electron transport layer 471. The second electron function layer 46 includes a second electron transport layer 461. Various alternative embodiments of the organic material layer may be practiced.

Optionally, the first emissive layer 41, the second emissive layer 45, and/or the additional electron transport layer 48 each has a thickness in the range of about 15 nm to about 80 nm. Optionally, the second emissive layer 45 and/or the additional electron transport layer 48 each has a thickness of about 20 nm. Optionally, the first emissive layer 41 has a thickness of about 60 nm.

Optionally, the second emissive layer 45 and the additional electron transport layer 48 are made of a same material. As discussed above, by making the second emissive layer 45 and the additional electron transport layer 48 using a same material in a single patterning process, the manufacturing process can be much simplified and the manufacturing costs much lowered.

Optionally, the first emissive layer 41 has a thickness in the range of about 50 nm to about 135 nm. The second emissive layer 45 has a thickness in the range of about 50 nm to about 300 nm. The first electron function layer 47 and/or the second electron function layer 46 each has a thickness of about 20 nm. The first interface modification layer 42 and the second interface modification layer 44 each has a thickness in the range of about 1 nm to about 3 nm. Various alternative embodiments of the organic material layer may be practiced.

By having a continuous and uniform organic material layer 4 throughout the first region and the second region, the colors of light from the emissive layer (i.e., unfiltered light) within the first region and the second region are the same. For example, the color of light from the emissive layer within the first region and the second region is yellow, and the color of light from the emissive layer (i.e., unfiltered light) within the third region is blue. As discussed above, in the conventional array substrate, the structure and/or material of the organic material layer 4 within the first region are different from those within the second region. For instance, in a conventional array substrate, the color of light from the emissive layer within the first region is red, the color of light from the emissive layer within the second region is green, and the color of light from the emissive layer within the third region is blue. Thus, the array substrate of the present disclosure has a strikingly different structure and arrangement. Specifically, as discussed above, the array substrate of the present disclosure includes only two separate emissive layer within each light emitting unit (e.g., a pixel), whereas the conventional array substrate includes three or more separate emissive layers. Further, the emissive layer within the first region and the second region is a continuous emissive layer extending throughout the first region corresponding to the first sub-pixel and the second region corresponding to the second sub-pixel, i.e., the pixel definition layer does not separate the first region from the second region of the emissive layer. Moreover, the structures and materials of the emissive layer/organic material layer (or sub-layers thereof) within the first region and the second region are the same. Accordingly, in some embodiments, the emissive layer within the first region and the second region has a much increased size (e.g., about twice, about 1.5 times to 2.5 times) as compared to that of the emissive layer within the third region (i.e., corresponding to the third sub-pixel). Due to the increased size of the emissive layer and the organic material layer 4 within the first region and the second region, the resolution of the emissive layer/sub-pixels are as limited by the accuracy of the printing/coating devices as in the conventional array substrate. Thus, a much higher resolution and improved image display quality can be achieved in a display panel having the array substrate according to the present disclosure.

Figure 6:
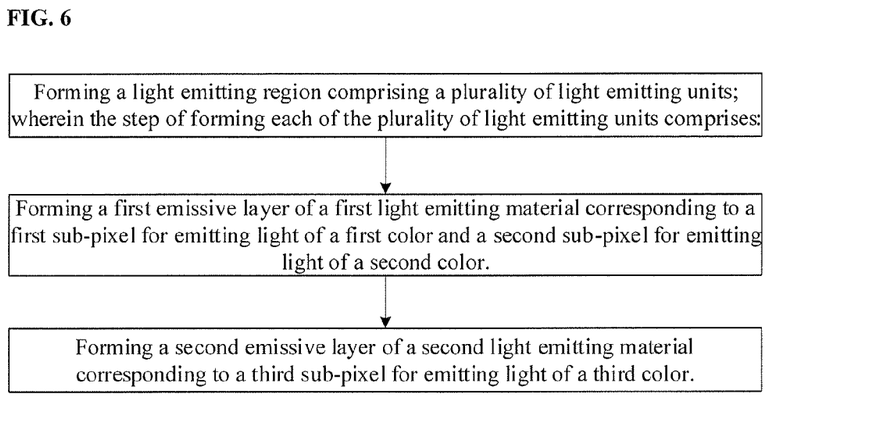
FIG. 6 is a flow chart illustrating a method of fabricating an array substrate in some embodiments.

In another aspect, the present disclosure provides a method of fabricating an array substrate. FIG. 6 is a flow chart illustrating a method of fabricating an array substrate in some embodiments. Referring to FIG. 6, the method in the embodiment includes forming a light emitting region having a plurality of light emitting units. In some embodiments, the step of forming each of the plurality of light emitting units includes forming a first emissive layer of a first light emitting material corresponding to a first sub-pixel for emitting light of a first color and a second sub-pixel for emitting light of a second color; and forming a second emissive layer of a second light emitting material corresponding to a third sub-pixel for emitting light of a third color. At least one of the first color and the second color is different from a color of light from the first emissive layer.

In some embodiments, the method further includes forming a first electrode layer on a substrate; wherein the first/second emissive layer is on a side of the first electrode layer distal to the base substrate; and forming a second electrode layer on a side of the first/second emissive layer distal to the first electrode layer. Optionally, the first electrode layer has a thickness in the range of about 50 nm to about 135 nm. In some embodiments, the method further includes forming a pixel definition layer separating the first emissive layer from the second emissive layer. Optionally, the pixel definition layer includes apertures exposing the first electrode layer. The organic material layer (including the first emissive layer and the second emissive layer) is formed on a side of the first electrode layer distal to the base substrate in regions corresponding to the apertures. The first emissive layer is a continuous emissive layer extending throughout a first region corresponding to the first sub-pixel and a second region corresponding to the second sub-pixel, i.e., the pixel definition layer does not separate the first region from the second region. The first region and the second region of the first emissive layer are integrally formed as one layer and are made of a same material. Optionally, the first region and the second region of each sub-layer (e.g., the first hole function layer, the first electron function layer, the first interface modification layer, the additional electron transport layer) of the organic material layer are integrally formed as one sub-layer and are made of a same material.

The electrode layer (e.g., the first electrode layer and/or the second electrode layer) can be made of any appropriate material. Optionally, one or both of the first electrode layer and the second electrode layer is made of a transparent conductive material, examples of which include, but are not limited to, indium tin oxide (ITO), indium zinc oxide (IZO), and aluminum-doped zinc oxide (AZO).

By having a continuous and uniform organic material layer 4 throughout the first region and the second region, the colors of light from the emissive layer (i.e., unfiltered light) within the first region and the second region are the same. For example, the color of light from the emissive layer within the first region and the second region is yellow, and the color of light from the emissive layer (i.e., unfiltered light) within the third region is blue. As discussed above, in the conventional array substrate, the structure and/or material of the organic material layer 4 within the first region are different from those within the second region. For instance, in a conventional array substrate, the color of light from the emissive layer within the first region is red, the color of light from the emissive layer within the second region is green, and the color of light from the emissive layer within the third region is blue. Thus, the array substrate of the present disclosure has a strikingly different structure and arrangement. Specifically, as discussed above, the array substrate of the present disclosure includes only two separate emissive layer within each light emitting unit (e.g., a pixel), whereas the conventional array substrate includes three or more separate emissive layers. Further, the emissive layer within the first region and the second region is a continuous emissive layer extending throughout the first region corresponding to the first sub-pixel and the second region corresponding to the second sub-pixel, i.e., the pixel definition layer does not separate the first region from the second region of the emissive layer. Moreover, the structures and materials of the emissive layer/organic material layer (or sub-layers thereof) within the first region and the second region are the same. Accordingly, in some embodiments, the emissive layer within the first region and the second region has a much increased size (e.g., about twice, about 1.5 times to 2.5 times) as compared to that of the emissive layer within the third region (i.e., corresponding to the third sub-pixel). Due to the increased size of the emissive layer and the organic material layer 4 within the first region and the second region, the resolution of the emissive layer/sub-pixels are as limited by the accuracy of the printing/coating devices as in the conventional array substrate. Thus, a much higher resolution and improved image display quality can be achieved in a display panel having the array substrate according to the present disclosure.

Figure 7:
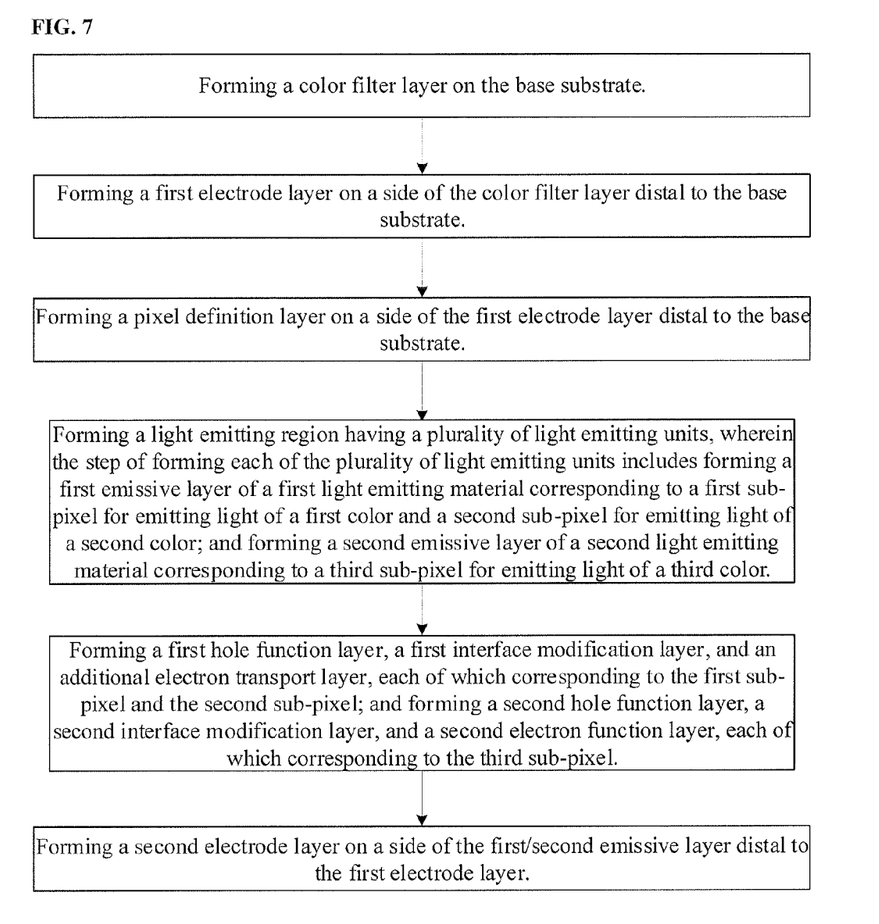
FIG. 7 is a flow chart illustrating a method of fabricating an array substrate in some embodiments.

FIG. 7 is a flow chart illustrating a method of fabricating an array substrate in some embodiments. Referring to FIG. 7, the method in the embodiment includes forming a color filter layer on the base substrate, forming a first electrode layer on a side of the color filter layer distal to the base substrate, forming a pixel definition layer on a side of the first electrode layer distal to the base substrate, and forming a light emitting region having a plurality of light emitting units. In some embodiments, the step of forming each of the plurality of light emitting units includes forming a first emissive layer of a first light emitting material corresponding to a first sub-pixel for emitting light of a first color and a second sub-pixel for emitting light of a second color; and forming a second emissive layer of a second light emitting material corresponding to a third sub-pixel for emitting light of a third color. At least one of the first color and the second color is different from a color of light from the first emissive layer. The pixel definition layer separates the first emissive layer from the second emissive layer.

Optionally, the pixel definition layer includes apertures exposing the first electrode layer. The organic material layer (including the first emissive layer and the second emissive layer) is formed on a side of the first electrode layer distal to the base substrate in regions corresponding to the apertures. The first emissive layer is a continuous emissive layer extending throughout a first region corresponding to the first sub-pixel and a second region corresponding to the second sub-pixel, i.e., the pixel definition layer does not separate the first region from the second region. The first region and the second region of the first emissive layer are integrally formed as one layer and are made of a same material. Optionally, the first region and the second region of each sub-layer (e.g., the first hole function layer, the first electron function layer, the first interface modification layer, the additional electron transport layer) of the organic material layer are integrally formed as one sub-layer and are made of a same material.

Referring to FIG. 7, the method in the embodiment further includes forming a first hole function layer, a first interface modification layer, and an additional electron transport layer, each of which corresponding to the first sub-pixel and the second sub-pixel; and forming a second hole function layer, a second interface modification layer, and a second electron function layer, each of which corresponding to the third sub-pixel. The first hole function layer, the first emissive layer, the first interface modification layer, and the additional electron transport layer are sequentially on the base substrate along a direction away from the base substrate. The second hole function layer, the second interface modification layer, the second emissive layer, and the second electron transport layer are sequentially on the base substrate along a direction away from the base substrate. The additional electron transport layer and the second emissive layer are in a same layer. The method as shown in FIG. 7 further includes forming a second electrode layer on a side of the first/second emissive layer distal to the first electrode layer.

Optionally, the first emissive layer is deposited using a solution-based process such as a printing process or a coating process.

Optionally, the first emissive layer, the second emissive layer, and/or the additional electron transport layer each has a thickness in the range of about 15 nm to about 80 nm. Optionally, the second emissive layer and/or the additional electron transport layer each has a thickness of about 20 nm. Optionally, the first emissive layer has a thickness of about 60 nm.

Optionally, the second emissive layer and the additional electron transport layer are formed in a same layer. Optionally, the second emissive layer and the additional electron transport layer are formed using a same material in a single patterning process. The manufacturing process can be much simplified and the manufacturing costs much lowered.

It should be understood that the steps or sub-steps thereof of the method in the present disclosure are not necessarily performed sequentially, and in general can be performed in parallel with each other wherever possible.

Optionally, the first hole function layer includes a first hole injection layer and a first hole transport layer. Optionally, the second hole function layer includes a second hole injection layer and a second hole transport layer. Optionally, the first electron function layer includes a first electron transport layer. Optionally, the second electron function layer includes a second electron transport layer.

By having a continuous and uniform organic material layer 4 throughout the first region and the second region, the colors of light from the emissive layer (i.e., unfiltered light) within the first region and the second region are the same. For example, the color of light from the emissive layer within the first region and the second region is yellow, and the color of light from the emissive layer (i.e., unfiltered light) within the third region is blue. As discussed above, in the conventional array substrate, the structure and/or material of the organic material layer 4 within the first region are different from those within the second region. For instance, in a conventional array substrate, the color of light from the emissive layer within the first region is red, the color of light from the emissive layer within the second region is green, and the color of light from the emissive layer within the third region is blue. Thus, the array substrate of the present disclosure has a strikingly different structure and arrangement. Specifically, as discussed above, the array substrate of the present disclosure includes only two separate emissive layer within each light emitting unit (e.g., a pixel), whereas the conventional array substrate includes three or more separate emissive layers. Further, the emissive layer within the first region and the second region is a continuous emissive layer extending throughout the first region corresponding to the first sub-pixel and the second region corresponding to the second sub-pixel, i.e., the pixel definition layer does not separate the first region from the second region of the emissive layer. Moreover, the structures and materials of the emissive layer/organic material layer (or sub-layers thereof) within the first region and the second region are the same. Accordingly, in some embodiments, the emissive layer within the first region and the second region has a much increased size (e.g., about twice, about 1.5 times to 2.5 times) as compared to that of the emissive layer within the third region (i.e., corresponding to the third sub-pixel). Due to the increased size of the emissive layer and the organic material layer 4 within the first region and the second region, the resolution of the emissive layer/sub-pixels are as limited by the accuracy of the printing/coating devices as in the conventional array substrate. Thus, a much higher resolution and improved image display quality can be achieved in a display panel having the array substrate according to the present disclosure.

Figure 8:
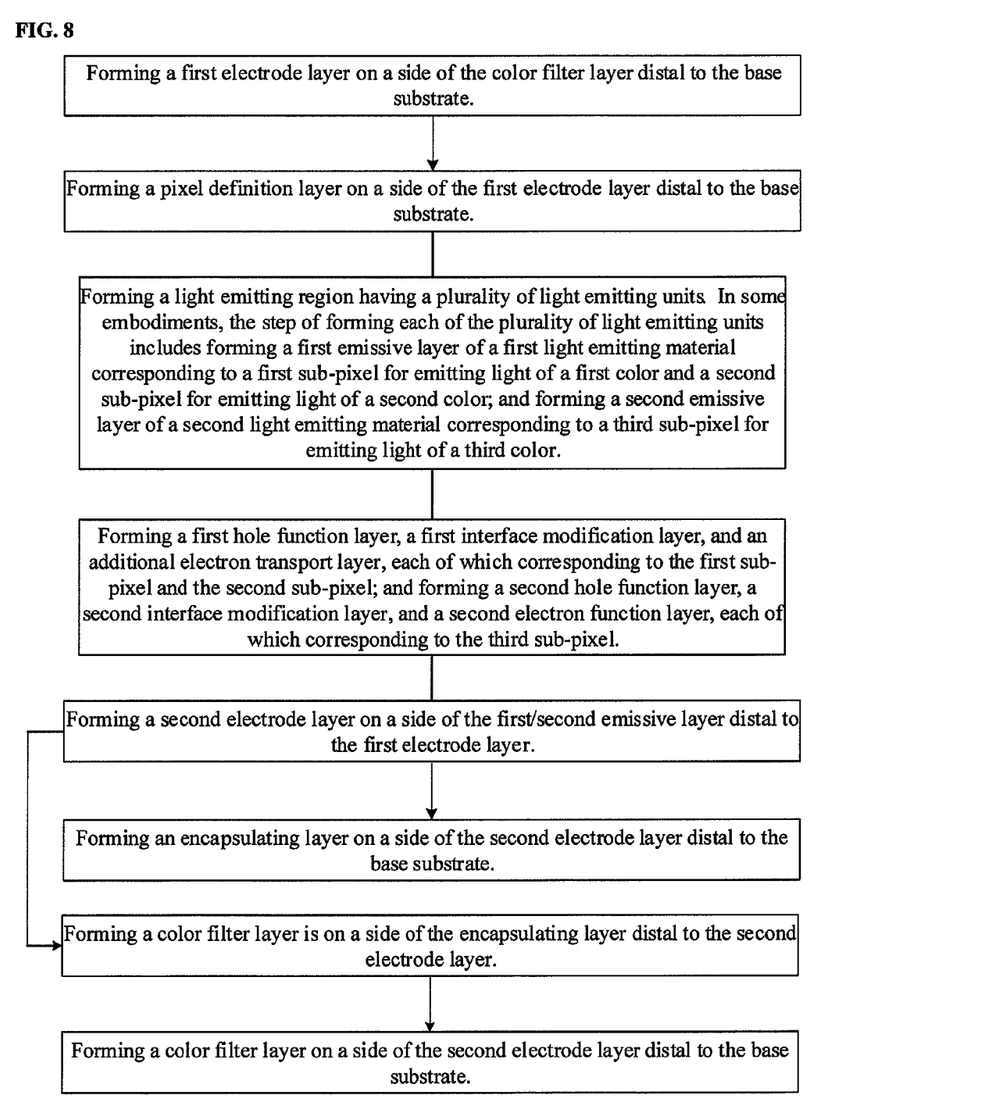
FIG. 8 is a flow chart illustrating a method of fabricating an array substrate in some embodiments.

FIG. 8 is a flow chart illustrating a method of fabricating an array substrate in some embodiments. Referring to FIG. 8, the method in the embodiment includes forming a first electrode layer on a side of the color filter layer distal to the base substrate, forming a pixel definition layer on a side of the first electrode layer distal to the base substrate, and forming a light emitting region having a plurality of light emitting units. In some embodiments, the step of forming each of the plurality of light emitting units includes forming a first emissive layer of a first light emitting material corresponding to a first sub-pixel for emitting light of a first color and a second sub-pixel for emitting light of a second color; and forming a second emissive layer of a second light emitting material corresponding to a third sub-pixel for emitting light of a third color. At least one of the first color and the second color is different from a color of light from the first emissive layer. The pixel definition layer separates the first emissive layer from the second emissive layer.

Optionally, the pixel definition layer includes apertures exposing the first electrode layer. The organic material layer (including the first emissive layer and the second emissive layer) is formed on a side of the first electrode layer distal to the base substrate in regions corresponding to the apertures. The first emissive layer is a continuous emissive layer extending throughout a first region corresponding to the first sub-pixel and a second region corresponding to the second sub-pixel, i.e., the pixel definition layer does not separate the first region from the second region. The first region and the second region of the first emissive layer are integrally formed as one layer and are made of a same material. Optionally, the first region and the second region of each sub-layer (e.g., the first hole function layer, the first electron function layer, the first interface modification layer, the additional electron transport layer) of the organic material layer are integrally formed as one sub-layer and are made of a same material.

Referring to FIG. 8, the method in the embodiment further includes forming a first hole function layer, a first interface modification layer, and an additional electron transport layer, each of which corresponding to the first sub-pixel and the second sub-pixel; and forming a second hole function layer, a second interface modification layer, and a second electron function layer, each of which corresponding to the third sub-pixel. The first hole function layer, the first emissive layer, the first interface modification layer, and the additional electron transport layer are sequentially on the base substrate along a direction away from the base substrate. The second hole function layer, the second interface modification layer, the second emissive layer, and the second electron transport layer are sequentially on the base substrate along a direction away from the base substrate. The additional electron transport layer and the second emissive layer are in a same layer. The method as shown in FIG. 8 further includes forming a second electrode layer on a side of the first/second emissive layer distal to the first electrode layer, and forming a color filter layer on a side of the second electrode layer distal to the base substrate, e.g., the color filter layer is formed adjacent to the second electrode layer. Alternatively, the method as shown in FIG. 8 further includes forming a second electrode layer on a side of the first/second emissive layer distal to the first electrode layer, forming an encapsulating layer on a side of the second electrode layer distal to the base substrate, and forming a color filter layer is on a side of the encapsulating layer distal to the second electrode layer.

Optionally, the first emissive layer is deposited using a solution-based process such as a printing process or a coating process.

Optionally, the first emissive layer, the second emissive layer, and/or the additional electron transport layer each has a thickness in the range of about 15 nm to about 80 nm. Optionally, the second emissive layer and/or the additional electron transport layer each has a thickness of about 20 nm. Optionally, the first emissive layer has a thickness of about 60 nm.

Optionally, the second emissive layer and the additional electron transport layer are formed in a same layer. Optionally, the second emissive layer and the additional electron transport layer are formed using a same material in a single patterning process. The manufacturing process can be much simplified and the manufacturing costs much lowered.

It should be understood that the steps or sub-steps thereof of the method in the present disclosure are not necessarily performed sequentially, and in general can be performed in parallel with each other wherever possible.

Optionally, the first hole function layer includes a first hole injection layer and a first hole transport layer. Optionally, the second hole function layer includes a second hole injection layer and a second hole transport layer. Optionally, the first electron function layer includes a first electron transport layer. Optionally, the second electron function layer includes a second electron transport layer.

By having a continuous and uniform organic material layer 4 throughout the first region and the second region, the colors of light from the emissive layer (i.e., unfiltered light) within the first region and the second region are the same. For example, the color of light from the emissive layer within the first region and the second region is yellow, and the color of light from the emissive layer (i.e., unfiltered light) within the third region is blue. As discussed above, in the conventional array substrate, the structure and/or material of the organic material layer 4 within the first region are different from those within the second region. For instance, in a conventional array substrate, the color of light from the emissive layer within the first region is red, the color of light from the emissive layer within the second region is green, and the color of light from the emissive layer within the third region is blue. Thus, the array substrate of the present disclosure has a strikingly different structure and arrangement. Specifically, as discussed above, the array substrate of the present disclosure includes only two separate emissive layer within each light emitting unit (e.g., a pixel), whereas the conventional array substrate includes three or more separate emissive layers. Further, the emissive layer within the first region and the second region is a continuous emissive layer extending throughout the first region corresponding to the first sub-pixel and the second region corresponding to the second sub-pixel, i.e., the pixel definition layer does not separate the first region from the second region of the emissive layer. Moreover, the structures and materials of the emissive layer/organic material layer (or sub-layers thereof) within the first region and the second region are the same. Accordingly, in some embodiments, the emissive layer within the first region and the second region has a much increased size (e.g., about twice, about 1.5 times to 2.5 times) as compared to that of the emissive layer within the third region (i.e., corresponding to the third sub-pixel). Due to the increased size of the emissive layer and the organic material layer 4 within the first region and the second region, the resolution of the emissive layer/sub-pixels are as limited by the accuracy of the printing/coating devices as in the conventional array substrate. Thus, a much higher resolution and improved image display quality can be achieved in a display panel having the array substrate according to the present disclosure.

In another aspect, the present disclosure provides a display panel including an array substrate described herein or fabricated by a method described herein, and a package substrate having a color filter layer. Optionally, the color filter layer is on a side of the package substrate distal to the array substrate. Optionally, the color filter layer is on a side of the package substrate proximal to the array substrate.

Figure 9:
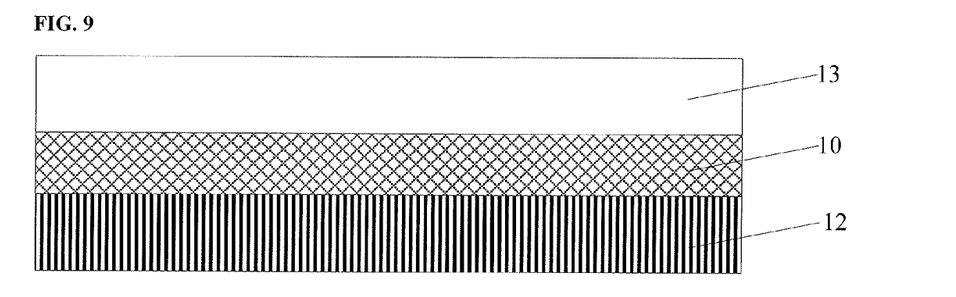
FIG. 9 is a diagram illustrating the structure of a display panel in some embodiments.
Figure 10:
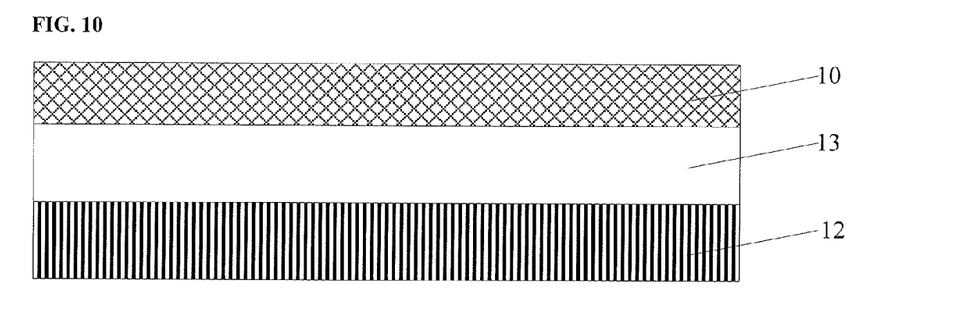
FIG. 10 is a diagram illustrating the structure of a display panel in some embodiments.

FIG. 9 is a diagram illustrating the structure of a display panel in some embodiments. FIG. 10 is a diagram illustrating the structure of a display panel in some embodiments. Referring to FIG. 9 and FIG. 10, the display panel in the embodiments includes an array substrate 12 and a package substrate 13. The array substrate 12 is an array substrate described herein or fabricated by a method described herein. For example, the array substrate 12 may include an organic material layer as shown in FIG. 5. Optionally, the package substrate 13 includes a color filter layer 10.

Referring to FIG. 9, the color filter layer 10 is on a side of the package substrate 13 proximal to the array substrate 12.

Referring to FIG. 10, the color filter layer 10 is on a side of the package substrate 13 distal to the array substrate 12.

By having a continuous and uniform organic material layer 4 throughout the first region and the second region, the colors of light from the emissive layer (i.e., unfiltered light) within the first region and the second region are the same. For example, the color of light from the emissive layer within the first region and the second region is yellow, and the color of light from the emissive layer (i.e., unfiltered light) within the third region is blue. As discussed above, in the conventional array substrate, the structure and/or material of the organic material layer 4 within the first region are different from those within the second region. For instance, in a conventional array substrate, the color of light from the emissive layer within the first region is red, the color of light from the emissive layer within the second region is green, and the color of light from the emissive layer within the third region is blue. Thus, the array substrate of the present disclosure has a strikingly different structure and arrangement. Specifically, as discussed above, the array substrate of the present disclosure includes only two separate emissive layer within each light emitting unit (e.g., a pixel), whereas the conventional array substrate includes three or more separate emissive layers. Further, the emissive layer within the first region and the second region is a continuous emissive layer extending throughout the first region corresponding to the first sub-pixel and the second region corresponding to the second sub-pixel, i.e., the pixel definition layer does not separate the first region from the second region of the emissive layer. Moreover, the structures and materials of the emissive layer/organic material layer (or sub-layers thereof) within the first region and the second region are the same. Accordingly, in some embodiments, the emissive layer within the first region and the second region has a much increased size (e.g., about twice, about 1.5 times to 2.5 times) as compared to that of the emissive layer within the third region (i.e., corresponding to the third sub-pixel). Due to the increased size of the emissive layer and the organic material layer 4 within the first region and the second region, the resolution of the emissive layer/sub-pixels are as limited by the accuracy of the printing/coating devices as in the conventional array substrate. Thus, a much higher resolution and improved image display quality can be achieved in a display panel having the array substrate according to the present disclosure.

In another aspect, the present disclosure provides a display device having a display panel as described herein. For example, the display device may include a display panel as shown in FIG. 9 or FIG. 10, or an array substrate as shown in any one of FIGS. 1-5. Examples of display devices include, but are not limited to, an OLED panel, a mobile phone, a tablet computer, a television, a monitor, a notebook computer, a digital album, a gps, etc.

By having a continuous and uniform organic material layer 4 throughout the first region and the second region, the colors of light from the emissive layer (i.e., unfiltered light) within the first region and the second region are the same. For example, the color of light from the emissive layer within the first region and the second region is yellow, and the color of light from the emissive layer (i.e., unfiltered light) within the third region is blue. As discussed above, in the conventional array substrate, the structure and/or material of the organic material layer 4 within the first region are different from those within the second region. For instance, in a conventional array substrate, the color of light from the emissive layer within the first region is red, the color of light from the emissive layer within the second region is green, and the color of light from the emissive layer within the third region is blue. Thus, the array substrate of the present disclosure has a strikingly different structure and arrangement. Specifically, as discussed above, the array substrate of the present disclosure includes only two separate emissive layer within each light emitting unit (e.g., a pixel), whereas the conventional array substrate includes three or more separate emissive layers. Further, the emissive layer within the first region and the second region is a continuous emissive layer extending throughout the first region corresponding to the first sub-pixel and the second region corresponding to the second sub-pixel, i.e., the pixel definition layer does not separate the first region from the second region of the emissive layer. Moreover, the structures and materials of the emissive layer/organic material layer (or sub-layers thereof) within the first region and the second region are the same. Accordingly, in some embodiments, the emissive layer within the first region and the second region has a much increased size (e.g., about twice, about 1.5 times to 2.5 times) as compared to that of the emissive layer within the third region (i.e., corresponding to the third sub-pixel). Due to the increased size of the emissive layer and the organic material layer 4 within the first region and the second region, the resolution of the emissive layer/sub-pixels are as limited by the accuracy of the printing/coating devices as in the conventional array substrate. Thus, a much higher resolution and improved image display quality can be achieved in a display panel having the array substrate according to the present disclosure.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:
1. An array substrate comprising:
a light emitting region comprising a plurality of light emitting units;
wherein each of the plurality of light emitting units comprising:
a first emissive layer of a first light emitting material for emitting a compound light having a first color and a second color; the first color corresponding to a color of light emitted from a first sub-pixel and the second color corresponding to a color of light emitted from a second sub-pixel;
a second emissive layer of a second light emitting material corresponding to a third sub-pixel for emitting light of a third color;
a first hole function layer, a first interface modification layer, and an additional electron transport layer, each of which corresponding to the first sub-pixel and the second sub-pixel;
a second hole function layer, a second interface modification layer, and a second electron function layer, each of which corresponding to the third sub-pixel; and
a pixel definition layer separating the first emissive layer from the second emissive layer;
wherein the first color and the second color are different from a color of light from the first emissive layer;
the first hole function layer, the first emissive layer, the first interface modification layer, and the additional electron transport layer are sequentially on the base substrate along a direction away from the base substrate;
the second hole function layer, the second interface modification layer, the second emissive layer, and the second electron transport layer are sequentially on the base substrate along a direction away from the base;
the additional electron transport layer and the second emissive layer are in a same layer;
each of the first emissive layer, the first hole function layer, the first interface modification layer, and the additional electron transport layer is a continuous layer extending throughout a first region corresponding to the first sub-pixel and a second region corresponding to the second sub-pixel;
the pixel definition layer is absent between the first sub-pixel and the second sub-pixel; and
the additional electron transport layer and the second emissive layer have a thickness in the range of approximately 15 nm to approximately 80 nm.

2. The array substrate of claim 1, wherein the color of light from the first emissive layer, the first color, the second color, and the third color are four different colors.

3. The array substrate of claim 1, wherein the first emissive layer has a size about twice that of the second emissive layer.

4. The array substrate of claim 1, further comprising a first electron transport layer extending throughout a first region corresponding to the first sub-pixel and a second region corresponding to the second sub-pixel; wherein the first electron transport layer is on a side of the additional electron transport layer distal to the base substrate; and the first electron transport layer and the second electron transport layer are in a same layer.

5. The array substrate of claim 1, wherein the additional electron transport layer and the second emissive layer have a thickness of approximately 20 nm, and the first emissive layer has a thickness of approximately 60 nm.

6. The array substrate of claim 1, further comprising:
a first color filter for converting light from the first emissive layer into the first color; and
a second color filter for converting light from the first emissive layer into the second color.

7. The array substrate of claim 6, further comprising:
a third color filter for converting light from the second emissive layer into the third color.

8. The array substrate of claim 1, wherein the first color, the second color and the third color are three different colors selected from red, green and blue, and the color of light from the first emissive layer is yellow.

9. The array substrate of claim 1, wherein the first light emitting material is a yellow light emitting material, and the second light emitting material is a blue light emitting material.

10. The array substrate of claim 1, wherein the first light emitting material is a mixture of a red light emitting material and a green light emitting material, and the second light emitting material is a blue light emitting material.

11. A display panel, comprising:
an array substrate of claim 1; and
a package substrate having a color filter layer.

12. A method of fabricating an array substrate, comprising:
forming a light emitting region comprising a plurality of light emitting units; wherein the step of forming each of the plurality of light emitting units comprising:
forming a first emissive layer of a first light emitting material for emitting a compound light having a first color and a second color; the first color corresponding to a color of light emitted from a first sub-pixel and the second color corresponding to a color of light emitted from a second sub-pixel;
forming a second emissive layer of a second light emitting material corresponding to a third sub-pixel for emitting light of a third color;
forming a first hole function layer, a first interface modification layer, and an additional electron transport layer, each of which corresponding to the first sub-pixel and the second sub-pixel,
forming a second hole function layer, a second interface modification layer, and a second electron function layer, each of which corresponding to the third sub-pixel; and
forming a pixel definition layer separating the first emissive layer from the second emissive layer;
wherein the first color and the second color are different from a color of light from the first emissive layer;
the first hole function layer, the first emissive layer, the first interface modification layer, and the additional electron transport layer are sequentially formed on the base substrate along a direction away from the base substrate;
the second hole function layer, the second interface modification layer, the second emissive layer, and the second electron transport layer are sequentially formed on the base substrate along a direction away from the base substrate;
the additional electron transport layer and the second emissive layer are formed in a same layer;
each of the first emissive layer, the first hole function layer, the first interface modification layer, and the additional electron transport layer is formed to be a continuous layer extending throughout a first region corresponding to the first sub-pixel and a second region corresponding to the second sub-pixel;
the pixel definition layer is absent between the first sub-pixel and the second sub-pixel; and
the additional electron transport layer and the second emissive layer are formed to have a thickness in the range of approximately 15 nm to approximately 80 nm.

13. The method of claim 12, wherein the color of light from the first emissive layer, the first color, the second color, and the third color are four different colors.

14. The method of claim 12, wherein the first emissive layer has a size about twice that of the second emissive layer.

15. The method of claim 12, further comprising forming a first electron transport layer extending throughout a first region corresponding to the first sub-pixel and a second region corresponding to the second sub-pixel; wherein the first electron transport layer is formed on a side of the additional electron transport layer distal to the base substrate; and the first electron transport layer and the second electron transport layer are formed in a same layer.

16. The method of claim 12, wherein the additional electron transport layer and the second emissive layer are formed to have a thickness of approximately 20 nm, and the first emissive layer is formed to have a thickness of approximately 60 nm.

17. The method of claim 12, further comprising:
forming a first color filter for converting light from the first emissive layer into the first color; and
forming a second color filter for converting light from the first emissive layer into the second color.

18. The method of claim 17, further comprising:
forming a third color filter for converting light from the second emissive layer into the third color.

19. The method of claim 12, wherein the first color, the second color and the third color are three different colors selected from red, green and blue, and the color of light from the first emissive layer is yellow.

20. The method of claim 12, wherein the first emissive layer is formed by a solution-based process.

* * * * *